United States Patent
Falter et al.

(10) Patent No.: US 8,217,686 B2
(45) Date of Patent: Jul. 10, 2012

(54) DRIVER CHIP FOR DRIVING AN INDUCTIVE LOAD AND MODULE HAVING A DRIVER CHIP

(75) Inventors: Johann Falter, Wenzenbach (DE); Franz Laberer, Regensburg (DE); Gunther Wolfarth, Regensburg-Harting (DE)

(73) Assignee: Continental Automotive GmbH, Hannover (DE)

( * ) Notice: Subject to any disclaimer, the term of this patent is extended or adjusted under 35 U.S.C. 154(b) by 335 days.

(21) Appl. No.: 12/701,696

(22) Filed: Feb. 8, 2010

(65) Prior Publication Data

US 2010/0201407 A1 Aug. 12, 2010

(30) Foreign Application Priority Data

Feb. 6, 2009 (DE) .................. 10 2009 007 790

(51) Int. Cl.
*H03K 3/00* (2006.01)
(52) U.S. Cl. ...................... 327/110; 327/434
(58) Field of Classification Search .......... 327/108–110, 327/170, 427, 434; 326/82–83
See application file for complete search history.

(56) References Cited

U.S. PATENT DOCUMENTS

| | | | |
|---|---|---|---|
| 5,828,141 A | 10/1998 | Foerster | |
| 5,828,247 A | 10/1998 | Moller et al. | |
| 6,788,128 B2* | 9/2004 | Tsuchida | 327/427 |
| 7,453,308 B2* | 11/2008 | Tihanyi | 327/108 |
| 7,579,880 B2* | 8/2009 | Ueda | 327/108 |

* cited by examiner

*Primary Examiner* — Long Nguyen
(74) *Attorney, Agent, or Firm* — Laurence A. Greenberg; Werner H. Stemer; Ralph E. Locher

(57) ABSTRACT

A driver chip for driving an inductive load and a module having a driver chip are provided. The driver chip contains a first transistor for coupling a first potential to a first output and a second transistor for coupling a second potential to the first output. A first protection circuit reduces an increased voltage between a control terminal and a load junction terminal of the first transistor. The driver chip has a first state in which the second transistor is turned off and the first transistor can switch a passive inductive load connected to the output. In a second state, the first transistor and the second transistor can switch an external power transistor connected to the first output. A second output is connected to a load junction terminal of the external power transistor. A second protection circuit reduces an increased voltage between the first and second outputs.

14 Claims, 6 Drawing Sheets

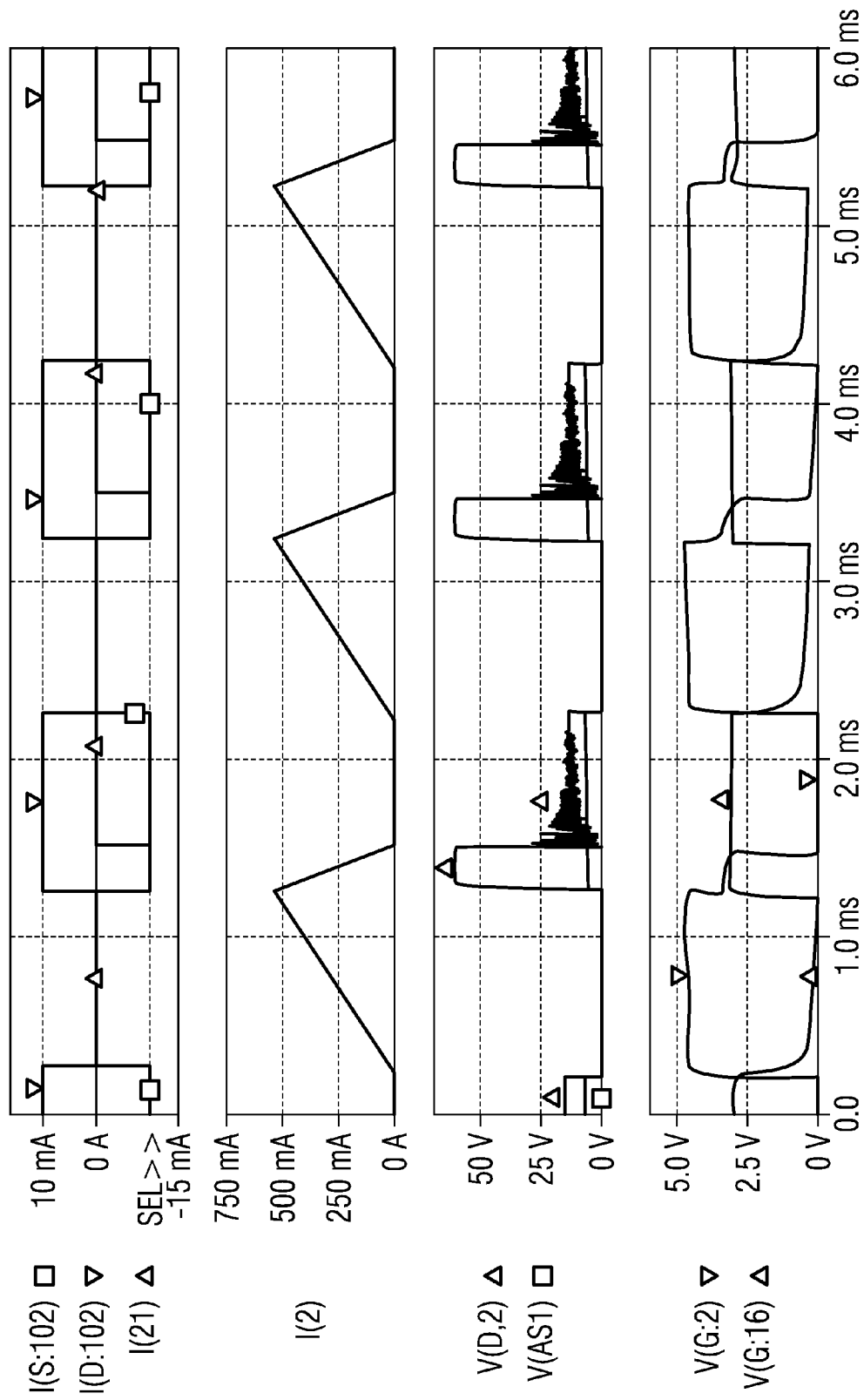

DRIVER CHIP FOR DRIVING AN INDUCTIVE LOAD AND MODULE HAVING A DRIVER CHIP

CROSS-REFERENCE TO RELATED APPLICATION

This application claims the priority, under 35 U.S.C. §119, of German Patent Application DE 10 2009 007 790.1, filed Feb. 6, 2009; the prior application is herewith incorporated by reference in its entirety.

BACKGROUND OF THE INVENTION

Field of the Invention

The invention relates to a driver chip for driving an inductive load. Driver chips are known in which an integrated power MOS field effect transistor with a relatively low drain-source resistance of less than 1.5 ohms is provided. The integrated field effect transistor can be used in a first operating mode to drive a passive load substantially formed of a resistive and an inductive component. The invention also relates to a module having a driver chip.

In another operating mode, the driver chip does not drive the load directly but drives the control input of an external power field effect transistor. That external field effect transistor usually has a very low drain-source resistance in the on-state, which is abbreviated as RDSON, of less than 0.1 ohms. The external field effect transistor is controlled by the internal power field effect transistor and a second internal transistor. The load is connected in series with the load junction or path of the field effect transistor. The difficulty in such a case is that in freewheeling mode, i.e. when the external transistor is turned off, an increased voltage is produced at the connection between the load and the external transistor, which can damage the external transistor.

U.S. Pat. No. 5,828,141 shows circuits for protecting a transistor in the event of freewheeling.

SUMMARY OF THE INVENTION

It is accordingly an object of the invention to provide a driver chip for driving an inductive load and a module having a driver chip, which overcome the hereinafore-mentioned disadvantages of the heretofore-known devices of this general type and which prevent an external transistor from being damaged when the external transistor is driven in freewheeling mode.

With the foregoing and other objects in view there is provided, in accordance with the invention, a driver chip for driving an inductive load. The driver chip comprises a first transistor for coupling a first potential to a first output of the driver chip and a second transistor for coupling a second potential to the first output of the driver chip. The driver chip additionally contains a first protection circuit for dissipating an increased voltage between a control terminal of the first transistor and a load junction terminal of the first transistor. The driver chip can be placed in a first state in which the second transistor is turned off and the first transistor is set up to switch a passive inductive load connected to the output. In a second state of the driver chip, the first transistor and the second transistor are set up to switch a power transistor connected to the first output. The driver chip additionally contains a second output for connection to a load junction terminal of the connected external power transistor. The driver chip also contains a second protection circuit for dissipating an increased voltage between the first output and the second output.

The driver chip is a configurable driver chip which can be placed in the first or second state depending on the driven load. With the second protection circuit, it is also possible to protect the external power transistor. It is no longer necessary to provide an external protection circuit for protecting the first power transistor. Such an external protection circuit would increase the component count and cost. Moreover, there is a risk of such an external protection circuit failing, e.g. in the case of open solder joints. The reliability of the overall system is therefore increased by having a second protection circuit on the driver chip.

In accordance with another feature of the invention, the second protection circuit contains two series-connected and oppositely-poled diodes. By suitably selecting the threshold voltages of the diodes, the voltage resulting in activation of the protection circuit, the so-called clamping voltage, can be set with low cost/complexity.

In accordance with a further feature of the invention, the first transistor is driven in the second state by at least one current mirror branch, so that the current through the first transistor is limited. This prevents the currents through the second protection circuit from becoming so high that they produce a temperature rise that is hazardous for the driver chip.

In accordance with an added, preferred feature of the invention, the first transistor is also driven in the first state through the use of a current mirror. Integrated circuits basically have a maximum value for the heat to be dissipated. In the first state, current flows through the driver chip when the first transistor is turned on. For this reason it is advisable to also limit this current.

In accordance with an additional feature of the invention, the first protection circuit has a transistor with a control input which is coupled to the second output. The first protection circuit therefore becomes activatable, as the transistor is turned on, or not, depending on the voltage at the second output. The first protection circuit is therefore only activated when required.

In accordance with again another feature of the invention, it is also advisable for the first protection circuit to be provided in such a way that it has two oppositely poled diodes connected in series. This enables the clamping voltage of the first protection circuit to be suitably set. In this case, at least one diode is preferably a Zener diode. The purpose of the other diode is, for example, to prevent unwanted feedback of the current.

In accordance with again a further feature of the invention, the first protection circuit can be switchably provided between the control input of the first transistor and the second output. If, in the first state, the first and second outputs are externally short-circuited, the first protection circuit is not required, i.e. it is deactivated, because the voltage across the first protection circuit will not exceed the predefined threshold value. If the first protection circuit is decoupled from the path of the control input and the second input, the capacitance at the node at which the protection circuit is connected can be reduced.

With the objects of the invention in view, there is also provided a module, comprising a driver chip according to the invention and an external power transistor. A control input of the external power transistor is connected to a first output and a load junction terminal is connected to the second output of the driver chip. The driver chip is placed in the second state and the second transistor is driven by a driver which applies a binary signal, and the first transistor is driven by a current source.

In order to turn the external power transistor on and off, the first and second transistors are required, since the control input of the external transistor must be able to be coupled to at least two different potentials.

However, it is particularly the current through the first transistor that is critical when current also flows through the first transistor to dissipate increased voltages. For this reason it is advisable for the first transistor to be driven by a current source in order to enable the current to be limited accordingly.

In accordance with another feature of the invention, the first protection circuit is switchably provided between the control input of the first transistor and the first output and, in the second state, the first protection circuit is decoupled from the control input of the first transistor. This reduces the capacitance at the control input of the first transistor, at the second output or at both nodes.

With the objects of the invention in view, there is also provided a module, comprising the driver chip according to the invention being placed in the first state, and an inductive load having a terminal connected to both the first driver chip output and the second driver chip output or a second driver chip input.

In a particularly suitable available circuit, the first transistor has an RDSON of between 0.2 and 1.5 ohms at 150 degrees Celsius. Power transistors with even lower RDSON do not usually lend themselves to integration in a chip at the same time as other components.

In accordance with a concomitant feature of the invention, the module is preferably constructed for use in an automobile. In automobiles there are a large number of loads to be switched that have a high inductive component, which means that the transistors which switch the loads are at risk in freewheeling mode.

To summarize, it can be stated that the reliability of the overall system is improved because the driver chip is itself internally protected by the first protection circuit. If an external field effect transistor is connected and an external protection circuit is not provided or the external protection circuit is not working, the second protection circuit ensures that the system will not be destroyed. Moreover, the integration of the external clamping structure, which is also referred to as a protection circuit, in the driver chip, means lower costs.

Other features which are considered as characteristic for the invention are set forth in the appended claims.

Although the invention is illustrated and described herein as embodied in a driver chip for driving an inductive load and a module having a driver chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 6 is a group of four graphs showing signal waveforms at selected nodes of the circuit as shown in FIG. 5.

DETAILED DESCRIPTION OF THE INVENTION

Figure 1:
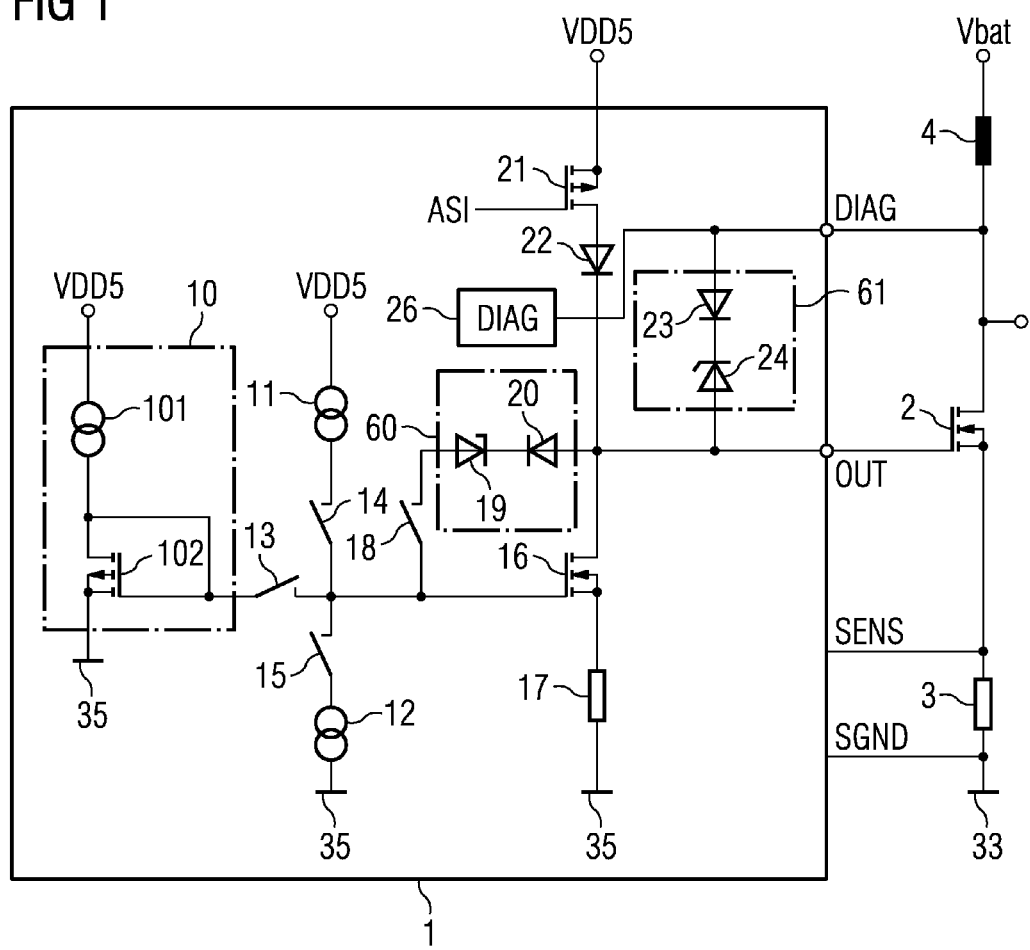
FIG. 1 is a schematic diagram of a first exemplary embodiment of a driver circuit with a connected load in a first state.

Referring now to the figures of the drawings in detail and first, particularly, to FIG. 1 thereof, there is seen a first exemplary embodiment of a driver chip 1 with an external transistor 2 connected thereto, which is implemented as a normally-off NMOS field effect transistor. A load 4 is also shown. It is also possible to use an IGBT, for example, as the transistor 2. The driver chip 1, which is implemented as an ASIC (application-specific integrated circuit), has a plurality of inputs and outputs, of which a first output OUT, a second output DIAG, a first input SENS and a second input SGND are shown in this figure. The first output OUT is connected to the gate of the transistor 2. The source of the transistor 2 is connected to a first terminal of a shunt resistor 3 having a second terminal which is connected to a chassis ground 33. The shunt resistor 3 has a value of 15 milliohms. The first terminal of the shunt resistor 3 is connected to the first input SENS and the chassis ground 33 is connected to the second input SGND.

The drain of the transistor 2 is connected to a first terminal of the load 4 having a second terminal which is connected to a potential Vbat provided by a battery. The load 4 has a high inductive component, e.g. an electronic injection valve or a solenoid valve. However, a load with a relatively high resistive component, such as a lambda probe or an $O_2$ sensor heater, can be connected as a load 4. The first terminal of the load 4 is connected to the second output DIAG. The transistor 2 can provide a current of e.g. 14 A. The current provided can vary depending on the type of transistor 2.

The driver chip 1 has a first transistor 16 and a second transistor 21. The first transistor 16 is a normally-off n-channel MOS field effect transistor, while the second transistor 21 is a likewise normally-off p-channel MOS field effect transistor. The first transistor 16 is connected to an internal chassis ground 35 through a shunt resistor 17. The drain of the first transistor 16 is connected to the cathode of a diode 22. The anode of the diode 22 is connected to the source of the second transistor 21. The source of the second transistor 21 is connected to a voltage supply node VDD5. A connecting node between the cathode of the diode 22 and the drain of the first transistor 16 is connected to the first output OUT.

In the configuration shown, in which the driver chip 1 drives a load 4 through the external transistor 2, the transistors 16 and 21 drive the control input of the external transistor 2. For this purpose, a digital signal AS1, having either the potential of the internal chassis ground 35 or the potential of the voltage VDD5, is applied to the second transistor 21. The driver chip 1 also has a first current mirror branch 10, a first switch 13, a current source 11, a switch 14, a current source 12 and a switch 15. The switches 13, 14 and 15 are each connected by a first terminal to the gate of the first transistor 16.

The switch 14 is connected in series with the current source 11. A terminal of the switch 14 is connected to the gate of the transistor 16 and a terminal of the current source 11 is connected to a voltage supply node VDD5. Conversely, the switch 15 and the current source 12 are provided in series between the gate of the transistor 16 and the chassis ground

35. The switches 14 and 15 are both open in this configuration. The current sources 11 and 12 are therefore inactive in this configuration.

The current mirror branch 10 has a current source 101 and an n-channel MOSFET 102 which is connected in series between the supply voltage nodes VDD5 and the internal chassis ground 35. A first terminal of the current source 101 is connected to the node VDD5, while a second terminal thereof is connected to the gate and the drain of the MOSFET 102. The source of the MOSFET 102 is connected to the internal chassis ground 35. The gate of the MOSFET 102 is additionally connected to a second terminal of the switch 13 which is closed in the configuration shown. The configuration is also referred to as the first state of the driver chip.

The current which is injected into the MOSFET 102 by the current source 101 is mirrored in the first transistor 16 by the circuit shown. The ratio of the sizes of the transistors 16 and 102 determines the ratio of the currents through the load junctions or load paths of these two transistors.

In order to switch off the external MOSFET 2, a high potential is provided at the gate of the second transistor 21 by the signal AS1 so that the second transistor 21 is nonconducting. The high potential is equal to VDD5. A current is injected into the first transistor 16 through the use of the current source 101, so that a low potential is present at the first output OUT. The current is defined by the current mirror 10. This current is in a range of 2 to 20 mA, for example. If we consider the transistor 16 as having an RDSON of 1.5 ohms at 150 degrees centigrade, it can carry a continuous current of 700 mA. The current is dependent on the package being used and the heat sinking of the package. The 2 to 20 mA can therefore be estimated uncritically. The external transistor 2 is turned off due to the current through the transistor 16.

In order to turn on the external transistor 2, a current of 0 A is injected into the first transistor 16 through the use of the current source 101, causing the latter transistor to be turned off. The signal AS1 provides a signal with a potential equal to ground potential, causing the transistor 21 to open. A voltage close to VDD5 minus the threshold voltage of the diode 22 is provided at the output OUT, so that the external MOSFET 2 is conducting. Consequently, the battery voltage is substantially dropped across the load 4.

The driver chip 1 has a first protection circuit 60 and a second protection circuit 61. The first protection circuit 60 contains a Zener diode 19 and a diode 20 which are oppositely poled and connected in series. A switch 18, which is provided between the gate of the first transistor 16 and the first protection circuit 60, is open in the configuration shown. The first protection circuit 60 is therefore inactive.

The second protection circuit 61, which includes diodes 23 and 24, is provided between the outputs DIAG and OUT. The anode of the diode 23 is connected to the second output DIAG, while the anode of the diode 24 is connected to the first output OUT. The cathodes of the two diodes 23 and 24 are interconnected. The diodes 23 and 24 are therefore oppositely poled. The diode 23 is forward biased. Its forward voltage is approximately between 0.6 and 0.7 V. The diode 23 is used to prevent injection in the backward direction. The diode 24 is implemented as a Zener diode. If the Zener diode has, for example, a Zener voltage of 48.5 V and the forward voltage of the diode 23 is 0.6 V, the second protection circuit provides a current path between the second output DIAG and the first output OUT as soon as a potential of 53.1 V is present at the drain of the transistor 2. It is assumed in this case that the turn-on voltage for the external transistor is 2.4 V. The voltage at the drain of the transistor 2 remains at 53.1 V until the stored energy in the inductor is dissipated.

When the external MOSFET 2 is turned off, i.e. is nonconducting, a high potential is formed at the second output DIAG because of the energy stored in the load 4. The second protection circuit is activated, because the voltage between the second output DIAG and the first output OUT attains the predefined threshold value. The energy is substantially dissipated in the transistor 2. Only a current of 2 to 20 mA is additionally required in order to turn on the transistor 2 through its gate in this "flyback" scenario. In the case of the external transistor 2, the stored energy is substantially dissipated in the external transistor 2. The protection structures only use up a negligibly small amount of energy. The current necessary for this purpose flows from the second output DIAG through the diode 23, the Zener diode 24, the load junction of the first transistor 16 and the shunt resistor 17 to the internal chassis ground 35.

It is self-evident that the internal chassis ground 35 is connected to the external chassis ground 33 through a terminal of the driver chip 1. The energy which is still present in the load after turn-off is therefore substantially dissipated in the transistor 2. This means that it is no longer necessary to have to provide an external protection circuit between the gate and the drain of the MOSFET 2.

The voltage at the drain of the transistor 2 remains at 53.1 V until the energy has been completely dissipated. The transistor 2 is then also finally turned off.

Figure 2:
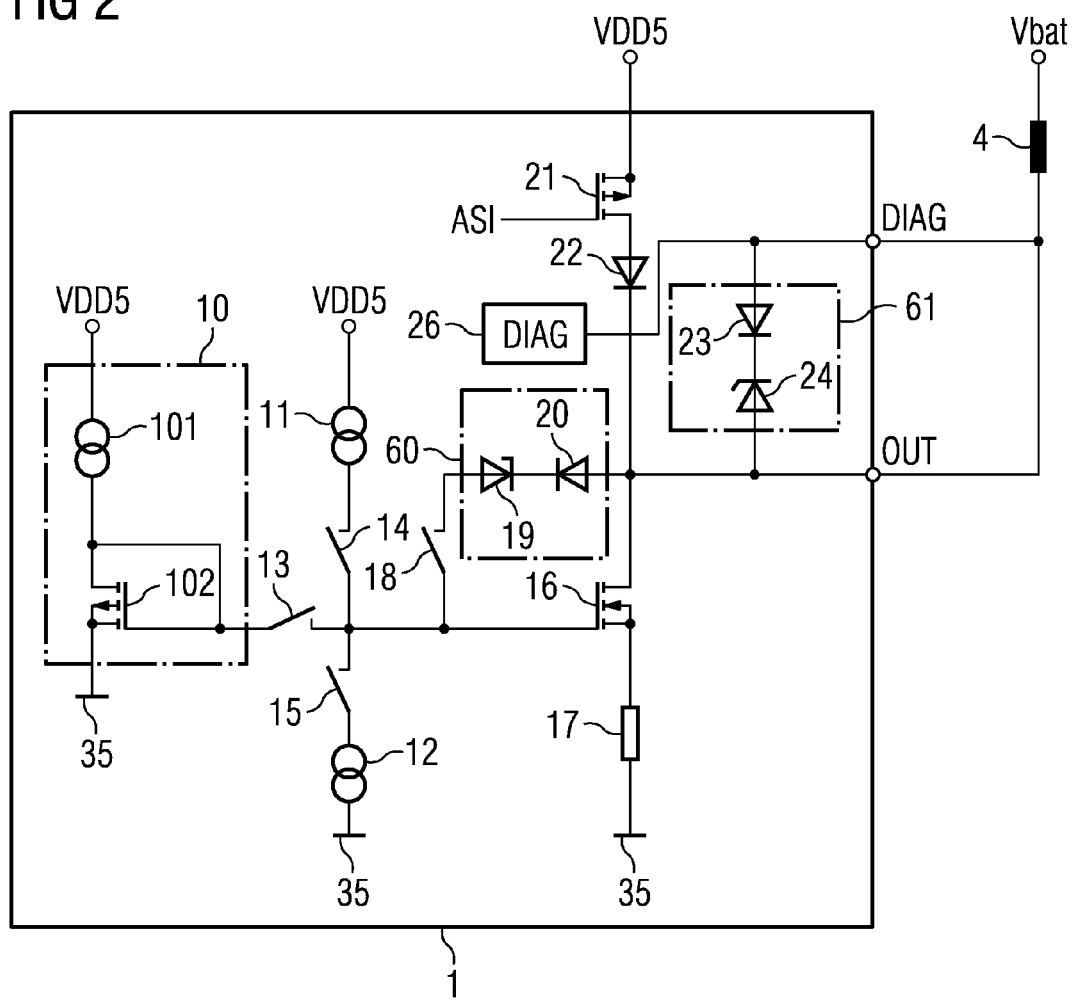
FIG. 2 is a schematic circuit diagram of the driver chip of FIG. 1 in a second state.

FIG. 2 shows the driver chip 1 with a load 4 connected at its outputs. A first terminal of the load 4 is connected directly to the first output OUT and the second output DIAG, while a second terminal thereof is connected to the positive battery potential Vbat, as in FIG. 1. The driver chip 1 is the same as in FIG. 1, but is configured differently. The configuration is indicated by the position of the switches. The switch 13 is open, whereas the switches switch 14, 15 and 18 are closed. In this configuration, the signal AS1 always drives a high potential, so that the second transistor 21 remains closed. The diode 22 ensures that there is no reverse current flow from the first output to the node VDD5.

The second protection circuit 61, including the diode 23 and the Zener diode 24, is inactive, since the first and second outputs are short-circuited through an external line.

A block 26, which is connected to the second output DIAG, incorporates diagnostic functions with which the voltage at the terminal for the load is measured and evaluated.

The load is switched through the use of the first transistor 16. The current through the first transistor 16 is set through the current sources 11 and 12 which determine whether the first transistor 16 is conducting or nonconducting. The current source 11 turns on the transistor 16 and the current sink 12 turns off the transistor 16. As the switch 18 is closed, the first protection circuit 60 including the Zener diode 19 and the diode 20 is active. The anode of the diode 20 is connected to the first output OUT, while the anode of the Zener diode 19 is connected to a first terminal of the switch 18. A second terminal of the switch 18 is connected to the gate of the first transistor 16. The cathodes of the diodes 19 and 20 are interconnected. If an increased potential forms at the first output OUT when the load 4 is disconnected, the first protection circuit 60 is activated so that current flows from the first output OUT through the diode 20, the Zener diode 19, the switch 18, the switch 15 and the current source 12 to the internal chassis ground 35, which ensures that the potential at the gate of the first transistor 16 increases. The latter is turned on, thereby dissipating the major part of the energy stored in the load.

The voltage at the output OUT results from the threshold voltages of the Zener diode 19 and the diode 20 and from the turn-on voltage of the first transistor 16. The voltage at the output OUT is also 53.1 V, for example.

Figure 3:
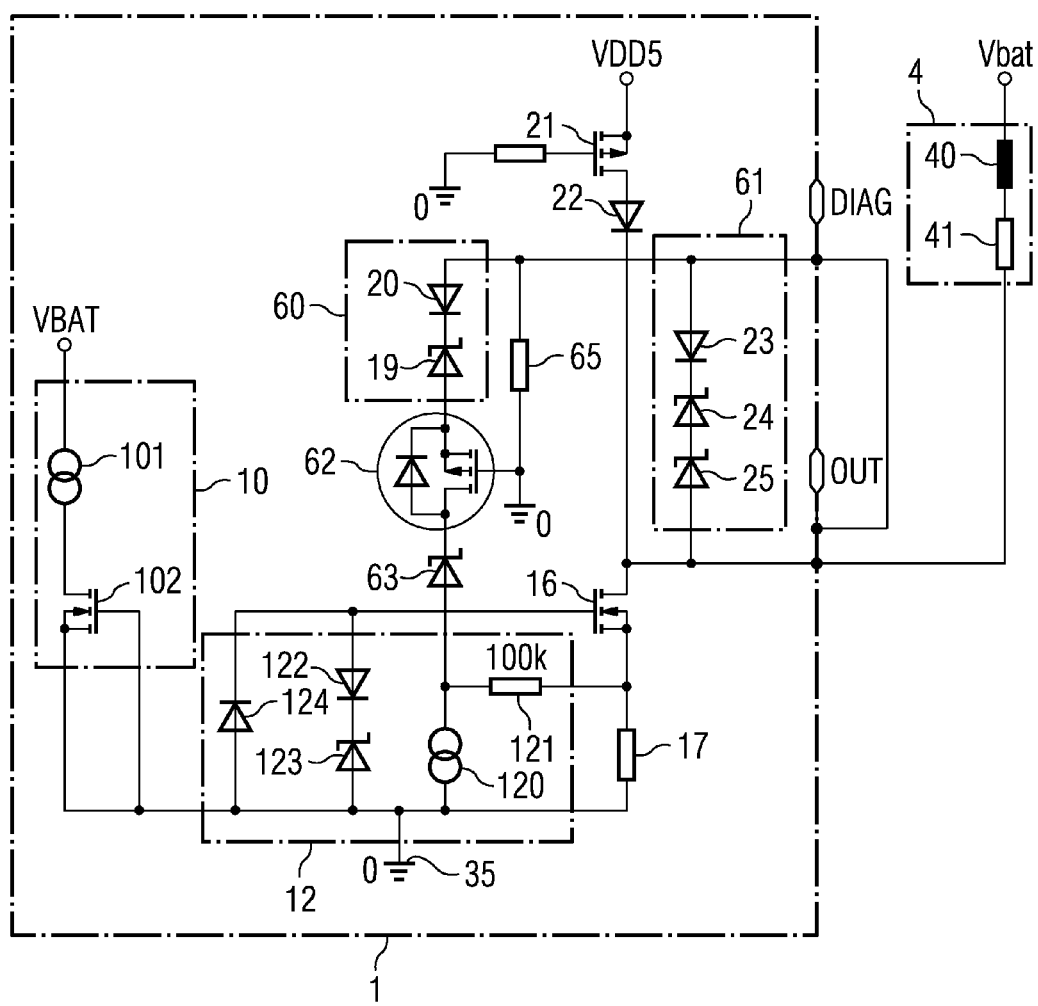
FIG. 3 is a schematic circuit diagram of a second exemplary embodiment of a driver chip.

FIG. 3 shows a second exemplary embodiment of a driver chip. The driver chip 1 is as shown in the second configuration in FIG. 2. The current source 101 and the transistor 102 are deactivated. The transistor 21 is implemented as a p-channel MOS field effect transistor. The gate of the second transistor 21 is at high potential, and the second transistor 21 is therefore nonconducting.

The first transistor 16 is an n-channel MOS field effect transistor with an RDSON, i.e. the resistance between the drain and the source in the on-state is less than 1.5 ohms. A low resistance value is selected so that not too much power is converted into heat in the first transistor 16 in the on-state. Like the first transistor 16, the transistor 102 is likewise implemented as a MOS field effect transistor.

The driver chip 1 is connected by its first output OUT and its second output DIAG to the load 4, which is shown as an inductor 40 connected in series with a resistor 41. The inductor 40 has a value of 20 mH, while the resistor 41 has a value of 5Ω (ohms).

The current source 12 is implemented by an interconnection of diodes 124, 122, 123, a resistor 121 and a switched current source 120. The anode of the diode 122 is connected to the gate of the first transistor 16, whereas the anode of the diode 123 is connected to the internal chassis ground 35. The cathodes of the diodes 122 and 123 are interconnected. The diode 123 is likewise implemented as a Zener diode.

If a predefined gate voltage is exceeded, the protection circuit including the diodes 122 and 123 becomes conducting so that the gate is protected from excessively high voltages. The diode 124 is connected by its anode to the chassis ground 35 and by its cathode to the gate of the first transistor 16. This diode prevents the voltage at the gate from becoming too negative.

The current source 120 is provided between the gate of the first transistor 16 and the chassis ground 35. The gate and source of the first transistor 16 are also interconnected through the 100 kΩ resistor 121.

The second protection circuit 61 additionally has, as compared to the example shown in FIG. 1, a second Zener diode 25 which is connected between the first Zener diode 24 and the first output OUT. The anode of this Zener diode 25 is connected to the second output OUT. Providing the second Zener diode increases the threshold value above which the second protection circuit 61 becomes conducting. However, because the first output OUT and the second output DIAG are short-circuited, the second protection circuit 61 is inactive in this configuration.

The first protection circuit 60 is connected to the gate of the first transistor 16 through the load junction of a transistor 62 and a diode 63. The cathode of the diode 63 is connected to the emitter of the transistor 62, which is implemented as a p-channel field effect transistor. The source of the transistor 62 is connected to the anode of the Zener diode 19. The gate of the transistor 62 is connected through a resistor 65 to the second output DIAG. The resistor 65 has a value of 10 kΩ. The gate is also connected to the chassis ground 35 through a low-resistance switch which is not shown in the figure, so that a potential close to 0 V referred to the internal chassis ground is present at the gate of the transistor 62. The transistor 62 is therefore always turned on.

The first protection circuit 60 is consequently active. It ensures that excessively high voltages between the drain and the gate of the first transistor 16 are dissipated, with the energy being, as described above, substantially dissipated by the first transistor 16.

The node VDD5 is operated from a voltage of 5 VDC, while the battery voltage Vbat is 12 VDC.

Figure 4:
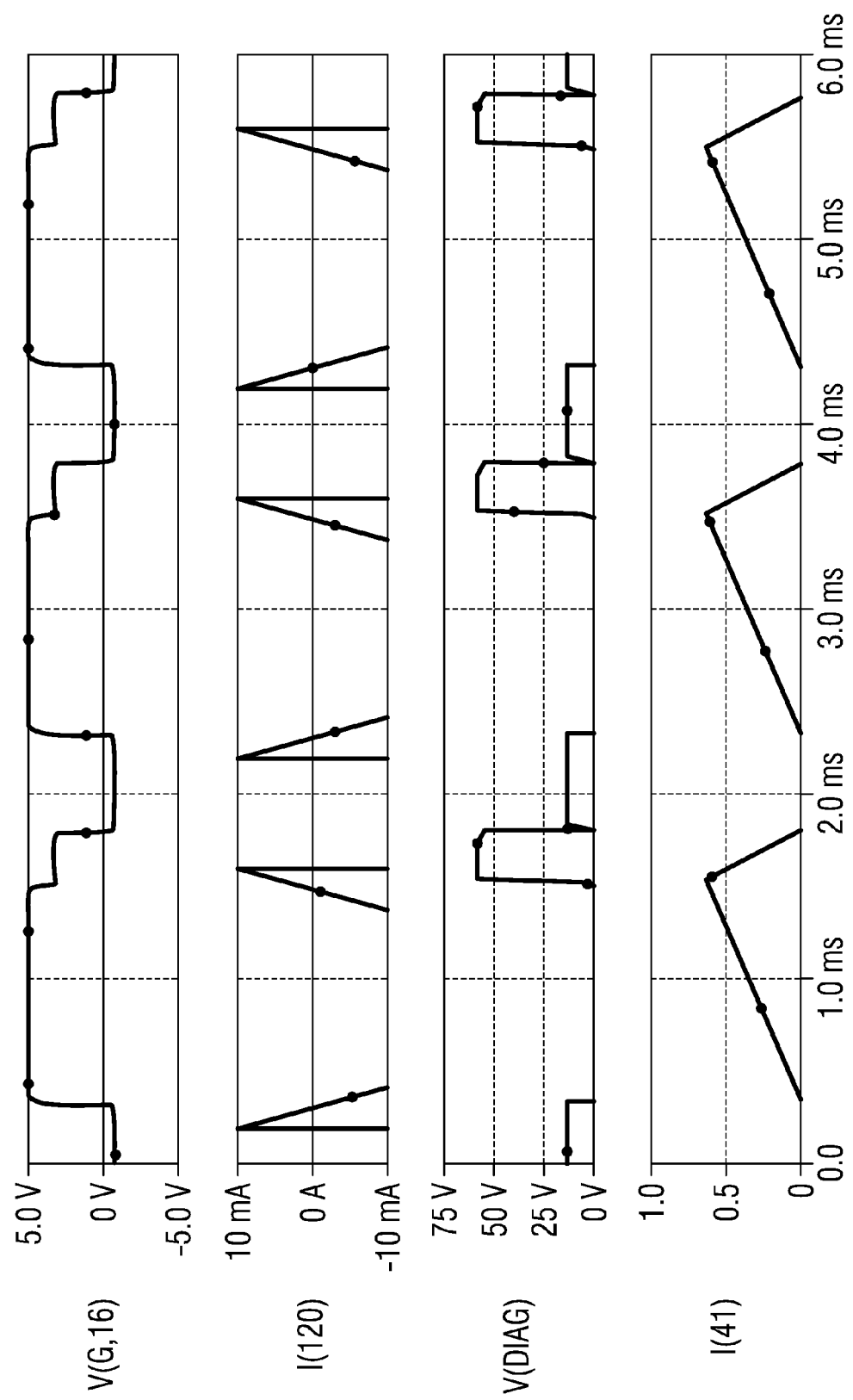
FIG. 4 is a group of four graphs showing signal waveforms at selected nodes of the circuit as shown in FIG. 3.

FIG. 4 shows voltage waveforms at selected nodes and current waveforms through selected components of FIG. 3.

The first diagram shows the voltage at the gate of the first transistor 16 as a function of time. The second diagram shows the current provided by the current source 120. The third diagram shows the voltage at the second output DIAG, while in the fourth diagram the current through the resistance 41 of the load 4 is shown.

In the period between 0 and 0.2 ms, a current of +10 mA is produced by the current source 120. The voltage at the gate is therefore negative at −0.8 V. The −0.8 V corresponds to the threshold voltage of the diode 124. The first transistor 16 is in the off state. The voltage at the second output DIAG is consequently equal to the battery voltage of 12 V. In the period between 0.2 and 0.4 ms, the voltage is reduced linearly to −10 mA. The gate voltage increases to 5 V over this period. As soon as the threshold voltage of the first transistor 16 is reached, it is turned on and ensures a potential of 0 V at the first or second output of the driver chip 1. The current through the load 4 increases linearly.

In the period between 1.4 and 1.6 ms, the current is increased again until it has reached a value of 10 mA. As soon as the gate voltage is close to the threshold voltage, the first transistor 16 begins to increase its source-drain resistance. The voltage at the first output OUT then jumps to around 60 V. Since the clamping voltage of the first protection circuit 60 is thereby reached, the gate of the transistor 16 is driven high by the first protection circuit 61. The energy is then dissipated in the first transistor 16. The current through the resistor 41 reduces according to an e-function until it has reached the value of 0 A, thereby dissipating the energy stored in the inductor. Since no more current flows through the first protection circuit 60, the gate voltage again falls to the minimum level and the voltage at the first output OUT is again 12 V. The processes described then recommence. In this configuration, the increased voltage at the output of the driver chip 1 is reduced by the internal first protection circuit 60 and the internal first transistor 16. The voltage remains approximately constant as long as the energy is dissipated. In this way, the drain is protected by ensuring that the voltage does not overshoot the e.g. 60 V and does not exceed the breakdown threshold of the technology, e.g. 80 V. The latter would result in destruction of the driver chip.

Figure 5:
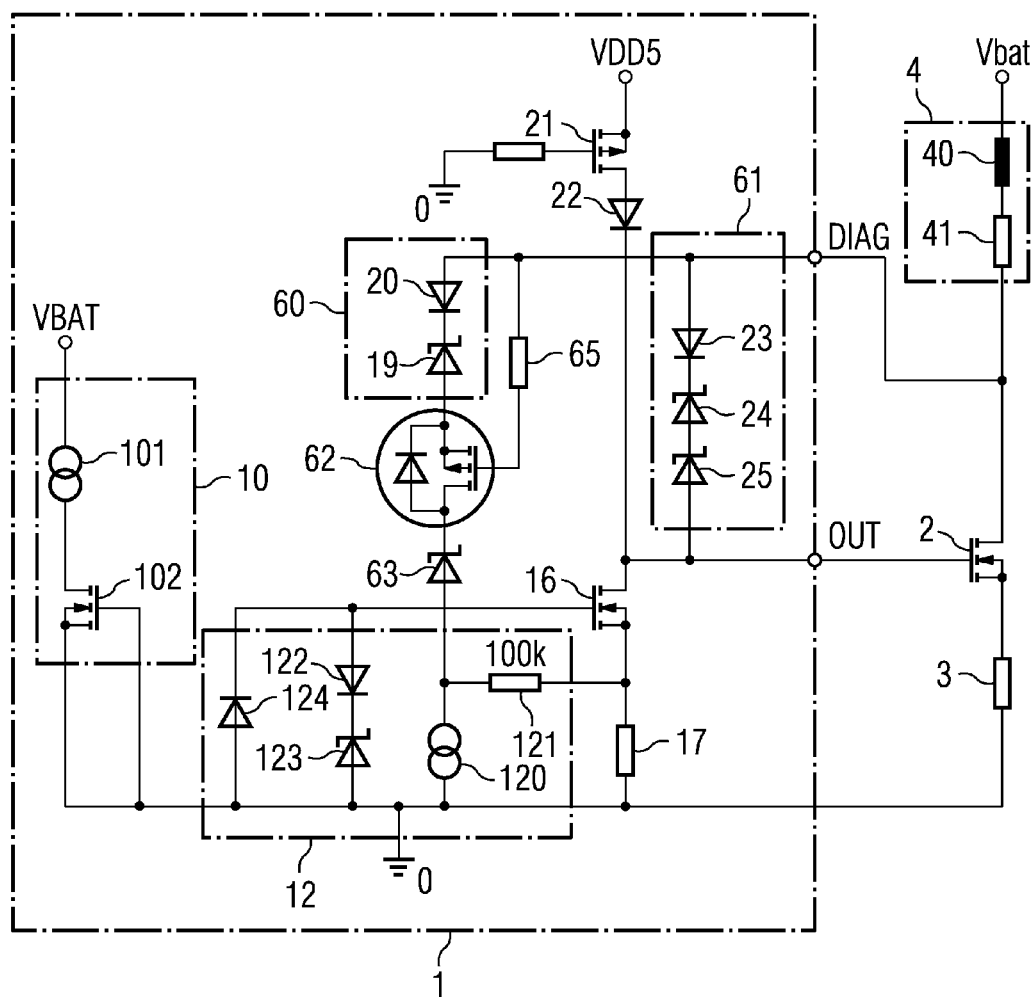
FIG. 5 is a schematic circuit diagram of the driver chip of FIG. 3 in another state.

FIG. 5 shows the driver chip from FIG. 3 in another configuration, in which the load is not driven directly but through an external transistor 2. The external transistor 2 is implemented as an n-channel power MOS field effect transistor. Its source is connected to a first terminal of the shunt resistor 3 and its drain is connected to a first terminal of the load 4 which is likewise shown as a series connection of an inductor 40 and a resistor 41. The drain is additionally connected to the second output DIAG of the driver chip 1. The first output OUT of the driver chip 1 is connected to the gate of the transistor 2. The first output OUT is driven by the first transistor 16 and the second transistor 21, as described in connection with FIG. 1.

Although the driver chip 1 is the same driver chip as in FIG. 3, for the sake of clarity the current source 12 is not shown with it in this case. The current mirror branch 10 is connected to the gate of the first transistor 16, with the gate and drain of the transistor 102 being short-circuited together and connected to the gate of the first transistor 16. The current source 101 therefore determines the current through the load junction of the transistor 102. This current is injected into the load junction of the transistor 16 through the use of the common gate connection.

The transistor 62 is no longer connected to the internal chassis ground 35 so that the potential at the gate of the transistor 62 is at the potential of the second output DIAG. The transistor 62 is therefore nonconducting, causing the first protection circuit 60 to be deactivated. However, the second protection circuit 61 is active. The function of the second protection circuit corresponds to the function as described in connection with FIG. 2.

FIG. 6 shows voltages at selected nodes and currents through selected components of the driver chip 1 from FIG. 5. The first diagram shows the currents through the transistor 102, through the transistor 16 and the diode 23 of the second protection circuit 61. The curve marked with a rectangle shows the current from the source of the transistor 102, the curve with the downward pointing triangle shows the current flowing into the drain of the transistor 102 and the curve with the upward pointing triangle shows the current flowing through the diode 23.

In the period between 0 and 0.2 ms, the current through the transistors 102 and 16 is 10 mA and −10 mA, respectively. Accordingly, no more current is injected by the current source 101 so that the current through these two transistors 102 and 16 is 0 in each case. The second diagram shows the current through the load junction of the external transistor 2. The third diagram shows, in the triangle-marked curve, the voltage at the drain of the transistor 2 and, with the curve marked with a rectangle, the signal AS1 for driving the second transistor 21.

The fourth diagram shows the voltage at the gate of the external transistor 2 and at the gate of the internal transistor 16. The downward pointing triangle indicates the voltage at the gate of the external transistor 2 and the upward pointing triangle indicates the voltage at the gate of the first transistor 16.

In the period between 0 and 0.2 ms, the signal AS1 drives a high level so that the second transistor 21 is nonconducting. On the other hand, the first transistor 16 is conducting, so that a voltage of 0 V is produced at the first output OUT of the driver chip 1 and therefore at the gate of the external transistor 2. The voltage at the gate of the first transistor 16 is 0 V.

From the time 0.2 ms onwards, no more current is injected. The voltage at the gate of the internal transistor 16 falls, since the gate capacitance of the transistor 16 is discharged by the 100 k resistor. The voltage at the gate falls to 0 V. Therefore, the current through the load junction of the first transistor 16 is 0. Simultaneously, the signal AS1 is also switched to 0 V so that the second transistor 21 is conducting. The potential at the gate of the external transistor 2 increases to a value slightly below 5 V. The external transistor 2 conducts so that the current through the load junction of the external transistor 2 increases from 0 A to 500 mA at the time 1.2 ms. At this point in time, the signal AS1 is brought to 5 V and the current through the current source 10 is brought to 10 mA. The voltage at the gate of the internal first transistor 16 increases to 3 V. The current through the load junction of this transistor 16 rises to −10 mA. The gate of the external transistor is discharged and the second transistor 21 begins to turn off.

In the inductor 40, energy is still present which continues to ensure current flow through the resistor 41, thereby causing the voltage to increase to 60 V at the drain of the external transistor 2. At the time 1.2 ms, the second protection circuit 61 is therefore activated. Current flows through this protection circuit to turn on the external transistor 2. This is recognizable by the current through the diode 23 which increases to −10 mA. The size of the current is limited by the size of the load current through the first transistor 16. The size of that load current is for its part set by the size of the current of the transistor 102. The 10 mA are necessary for discharging the gate of the external transistor 2 and for ensuring that the current through the second protection circuit 61 is significantly greater than 10 mA. A current of 10 mA then flows through the second protection circuit, plus the current necessary for increasing the potential at the gate of the external transistor 2 in such a way that a voltage is produced which turns on the external transistor 2.

At the time 1.45 ms, the voltage at the drain of the external transistor falls to 12 V. No more current flows through the diode 23 and the voltage at the first output and therefore at the gate of the transistor 2 falls to 0 V. From the time 2 ms onwards, the cycle described recommences.

In general, it can be stated that the energy in the inductor is dissipated more quickly the higher the protection threshold is selected. In the examples, the protection threshold results from the sum of the threshold voltage of the respective transistor and the threshold voltages of the diodes of the protection circuit. It can also be stated that the charging and discharging of the load inductor takes place according to the natural exponential function.

The invention claimed is:

1. A driver chip for driving an inductive load, the driver chip comprising:
    a first driver chip output connected to the inductive load;
    a first transistor for coupling a first potential to said first driver chip output;
    a second transistor for coupling a second potential to said first driver chip output;
    a first protection circuit for reducing an increased voltage between a load junction terminal of said first transistor and a control terminal of said first transistor;
    said driver chip configured to be placed in a first state having said second transistor turned off and said first transistor set up to switch the inductive load;
    said driver chip configured to be placed in a second state having said first transistor and said second transistor set up to switch an external power transistor connected to said first driver chip output;
    a second driver chip output for connection to a load junction terminal of the connected external power transistor; and
    a second protection circuit for reducing an increased voltage between said first driver chip output and said second driver chip output.

2. The driver chip according to claim 1, wherein said second protection circuit has two series-connected and oppositely poled diodes.

3. The driver chip according to claim 1, which further comprises at least one current mirror branch driving said first transistor in said second state.

4. The driver chip according to claim 1, which further comprises at least one current mirror branch driving said first transistor in said first state.

5. The driver chip according to claim 1, wherein said first protection circuit contains a transistor having a control input switchably coupled to said second driver chip output.

6. The driver chip according to claim 1, wherein said first protection circuit has two series-connected and oppositely poled diodes.

7. The driver chip according to claim 6, wherein at least one of said diodes of said first protection circuit is a Zener diode.

8. The driver chip according to claim 1, wherein said first protection circuit is switchably connected between the control input of said first transistor and said first driver chip output.

9. The driver chip according to claim 1, wherein said first transistor and said second transistor are each field effect transistors.

10. A module, comprising:
a driver chip according to claim 1 having a current source driving said first transistor, said driver chip being placed in said second state and said second transistor of said driver chip being driven by a binary signal; and
said external power transistor having a control input connected to said first driver chip output and a load junction terminal connected to said second driver chip output.

11. The module according to claim 10, wherein said first protection circuit is switchably connected between the control input of said first transistor and said second driver chip output, and said first protection circuit, when placed in said second state, is decoupled from the control input of said first transistor.

12. A module, comprising:
a driver chip according to claim 1 being placed in said first state; and
said inductive load having a terminal connected to both said first driver chip output and said second driver chip output.

13. The module according to claim 10, wherein the module is configured for use in an automobile.

14. The module according to claim 12, wherein the module is configured for use in an automobile.

* * * * *